United States Patent [19]

Nishitsuka et al.

[11] Patent Number: 5,212,881

[45] Date of Patent: May 25, 1993

[54] ELECTRONIC COMPONENT MOUNTING APPARATUS

[75] Inventors: Takashi Nishitsuka; Tohma Yamaguchi, both of Kanagawa, Japan

[73] Assignee: Tokico Ltd., Kanagawa, Japan

[21] Appl. No.: 762,496

[22] Filed: Sep. 19, 1991

[30] Foreign Application Priority Data

Sep. 20, 1990 [JP] Japan .................................. 2-251031
Sep. 20, 1990 [JP] Japan .................................. 2-251032

[51] Int. Cl.⁵ .......................... B23P 19/00; H05K 3/30
[52] U.S. Cl. ........................................ 29/740; 29/741; 29/720; 29/836
[58] Field of Search .................. 29/720, 721, 740, 741, 29/833, 834, 835, 836; 358/101

[56] References Cited

U.S. PATENT DOCUMENTS 4,546,384 10/1985 Kowalski ............................ 358/101
4,675,993 6/1987 Harada ................................. 29/740

Primary Examiner—P. W. Echols
Attorney, Agent, or Firm—Wenderoth, Lind & Ponack

[57] ABSTRACT

An electronic component mounting apparatus includes: a component storing section for storing electronic components, a mounting head for picking up a selected electronic component from the storing section it to and carrying and mounting it on a base member of an electronic module at a designated position, and a recognition devices for recognizing the image of the component being held by the head. The component being held by the head is prevented from being mounted on the base member when it is judged to be unsuitable for mounting by the recognition device. The recognition device can identify why a component is unsuitable for mounting.

3 Claims, 20 Drawing Sheets

Fig. 5

ACTIVE PROGRAM

| STEP NUMBER | COMPONENT SUPPLY DATA | | MOUNTING DATA | | REFERENCE DATA | |
|---|---|---|---|---|---|---|
| | LOCATION | SUPPLY METHOD | LOCATION | ...... | SHAPE | CONDITION FOR SHAPE JUDGEMENT | ..... |
| 1 | | | | | | | |
| ... | | | | | | | |
| i | | | | | | | |
| n | | | | | | | |

Fig. 9

ACTION PROGRAM

| STEP NUMBER | COMPONENT NUMBER | . . . | SUCTION POSITION | MOUNTING POSITION |
|---|---|---|---|---|
| 1 | 101 | . . . | $X_{B1}, Y_{B1}$ | $X_{M1}, Y_{M1}$ |
| 2 | 103 | . . . | $X_{B2}, Y_{B2}$ | $X_{M2}, Y_{M2}$ |
| 3 | 105 | . . . | $X_{B3}, Y_{B3}$ | $X_{M3}, Y_{M3}$ |
| . . . | . . . | . . . | . . . | . . . |
| n | 999 | . . . | $X_{Bn}, Y_{Bn}$ | $X_{Mn}, Y_{Mn}$ |

Fig. 10

COMPONENT DATA TABLE

| COMPONENT NUMBER | . . . | STORING POSITION NUMBER | RECOGNITION | . . . |
|---|---|---|---|---|
| 101 | . . . | 1 | NO | . . . |
| 102 | . . . | 1 | NO | . . . |
| 103 | . . . | 3 | YES | . . . |
| ⋮ | . . . | ⋮ | | . . . |
| 999 | . . . | 5 | NO | . . . |

Fig. 11

STORING POSITION TABLE

| STORING POSITION NUMBER | . . . | STORING POSITION |
|---|---|---|
| 1 | . . . | $X_1, Y_1$ |
| 2 | . . . | $X_2, Y_2$ |
| 3 | . . . | $X_3, Y_3$ |
| ⋮ | ⋮ | ⋮ |
| m | . . . | $X_m, Y_m$ |

Fig. 19

ACTIVE PROGRAM

| STEP NUMBER | COMPONENT SUPPLY DATA | | | MOUNTING DATA | | | RECOGNITION REFERENCE DATA | | SUCTION DATA | |
|---|---|---|---|---|---|---|---|---|---|---|
| | COMPONENT NO. | UP POSITION | ...... | MOUNTING POSITION | DISPOSAL POSITION | ...... | COMPONENT REFERENCE DATA | MOUNTING REFERENCE DATA | LEVEL | TIMING |
| 1 | | | | | | | | | | |
| . | | | | | | | | | | |
| . | | | | | | | | | | |
| 1 | | | | | | | | | | |
| . | | | | | | | | | | |
| . | | | | | | | | | | |
| n | | | | | | | | | | |

Fig. 20A

| COMPONENT NO. | COMPONENT ERROR | RECOGNITION ERROR | ORIGINES OF UNSUITABILITY ||||
|---|---|---|---|---|---|---|
| | | | PIN (V) BEND | PIN (T) BEND | PIN (P) BEND | CRACK |
| 1 | | | | | | |
| 2 | | | | | | |
| ... | | | | | | |
| ... | | | | | | |
| n | | | | | | |

Fig. 20B

| PICKING UP POSITION | SUPPLY SECTION ERROR |
|---|---|
| | |
| | |
| | |
| | |
| | |
| | |
| | |
| | |

Fig. 20C

| NOZZLE NO. | NOZZLE ERROR |
|---|---|
| | |
| | |
| | |
| | |
| | |

ELECTRONIC COMPONENT MOUNTING APPARATUS

BACKGROUND OF THE INVENTION

1. Field of the Invention

The present invention relates to an electronic component mounting apparatus for automatically mounting an electronic component on a base member of an electronic module such as, for example, a printed circuit board.

2. Prior Art

FIG. 1 shows one example of a conventional electronic component mounting apparatus. The apparatus includes a body 1. The body is provided with a component supply section 12 defined thereon on which a tray is set. A plurality of electronic components are received and arrayed in the tray. The apparatus further includes a mounting head 3 for applying suction to hold one of the components in the tray designated in a program and for carrying it to a place designated in the program. The apparatus further includes a recognition device 4 for recognizing an image of a component held by the head 3 and for judging whether the component is suitable for mounting on a circuit board supported on a support section 5 defined on the body 1. The judgement is carried out by comparing the actual image data of the component obtained by the recognition device 4 with reference data preset for judgement. When the recognition device 4 judges the component to be suitable for mounting, the mounting head 3 carries the component to a designated point on the circuit board on the support section 5 and mounts is thereon. When the recognition device 4 judges the component to be unsuitable for mounting, the head 3 carries the component to a disposal section 7 defined on the body 1 and releases its hold on the component to allow the component to fall into the disposal section 7. Shown at 6 and 8 are a controller and an operation board, respectively.

The conventional apparatus suffers from the following problems.

In the conventional apparatus, when any component is judged to be unsuitable for mounting, it is dropped into the disposal section. When dropped, the component may be deformed upon impact, thereby resulting in a situation wherein it is impossible to judge which part of the component was originally defective, how great such a defect was and so on, namely, the condition of the component when the component is judged to be unsuitable for mounting.

Sometimes the image data obtained by the recognition device 4 may be so poor that the device 4 is not able to recognize the image of the component correctly. At other times, a component may be extremely mis-positioned with respect to the head 3 when it is held by the head 3 so that the recognition device is also unable to recognize the image of the component correctly. In those cases, the recognition device 4 judges the component to be unsuitable for mounting. The recognition device 4 may, therefore, perform a misjudgement, and judge a good component to be unsuitable for mounting and dispose of it. When disposed of, such a component may be damaged, thereby making re-use of the component impossible.

In the conventional apparatus, the success rate of mounting is obtained as production managing information. In this connection, it is noted that there are two reasons for electronic components being judged unsuitable for mounting. One is when the mounting head 3 fails to hold a component in the condition predetermined in the program so that the head fails to hold the component, or so that the component is mis-positioned with respect to the head. The other is when leads of the component are damaged by being bent or the shape of the component itself is distorted. In the conventional electronic component mounting apparatus, the production managing information cannot be sorted according to respective causes of unsuitability.

SUMMARY OF THE INVENTION

In view of the foregoing, it is the main object of this invention to provide an electronic component mounting apparatus which is able to identify a component unsuitable for mounting on the base member of an electronic module such as, for example, a printed circuit board, due to deformation, misholding or mis-positioning of the component.

An electronic component mounting apparatus of the present invention comprises a component storing section for storing electronic components, a mounting head for picking up a selected electronic component from the storing section and carrying it to a designated place, and for mounting the component on the base member at a designated position, and recognition means for recognizing the image of the component being held by the head and for judging whether the component being held by the head is suitable for being mounted on the base member in accordance with the manner in which the component is held by the head and with the shape of the component itself. The component is able to be mounted on the base member when in a suitable state while being prevented from being mounted on the base member when it is judged to be deformed, misheld or mis-positioned. The recognition means identifies a component that is unsuitable for mounting.

Other features and advantages of the invention will be apparent from the following description in connection with the accompanying drawings.

BRIEF DESCRIPTION OF THE DRAWINGS

FIG. 5 is a diagram of an active program for automatic operation of the apparatus of FIG. 1;

FIG. 9 is a diagram of an active program for automatic operation of the apparatus of FIG. 6;

FIGS. 10 and 11 are tables of component data and storing positions, respectively;

FIG. 19 is a diagram of an active program of the third embodiment;

FIGS. 20A, 20B, and 20C are tables of production managing data;

DETAILED DESCRIPTION OF THE PREFERRED EMBODIMENT

Figure 1:
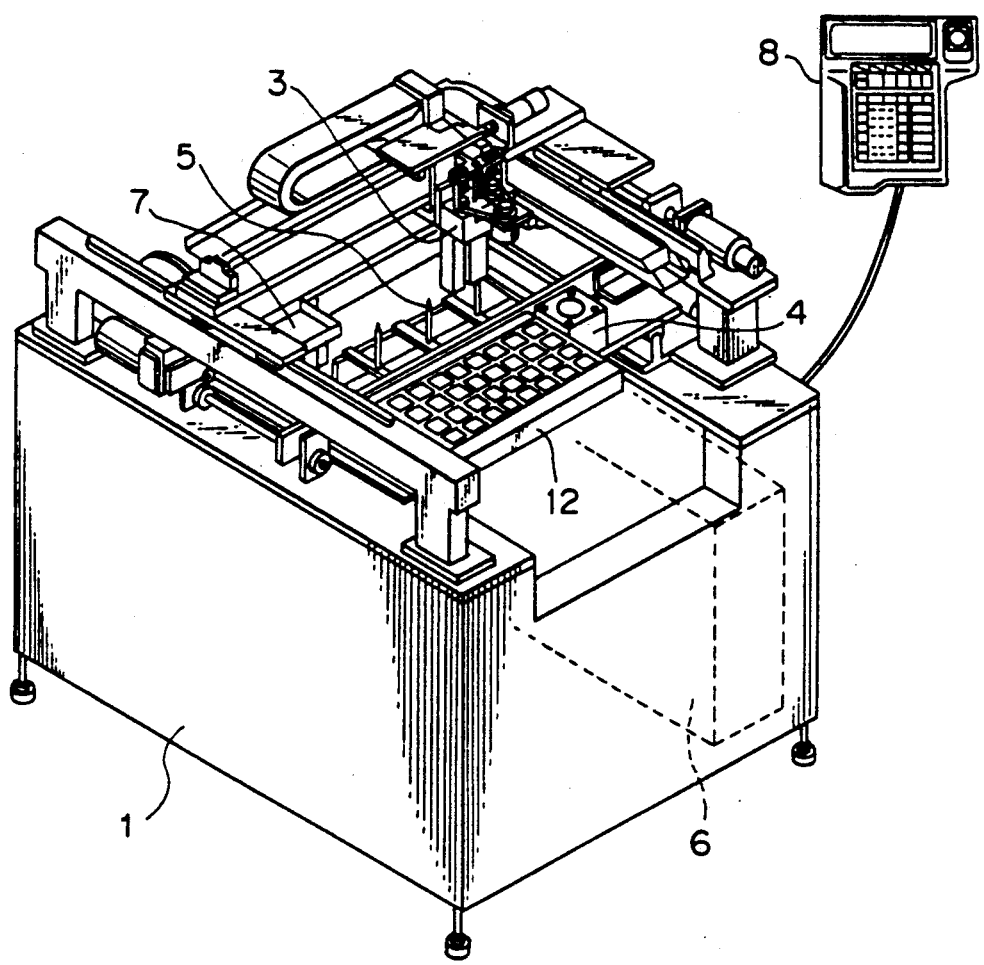
FIG. 1 is a perspective view of a conventional electronic component mounting apparatus.
Figure 2:
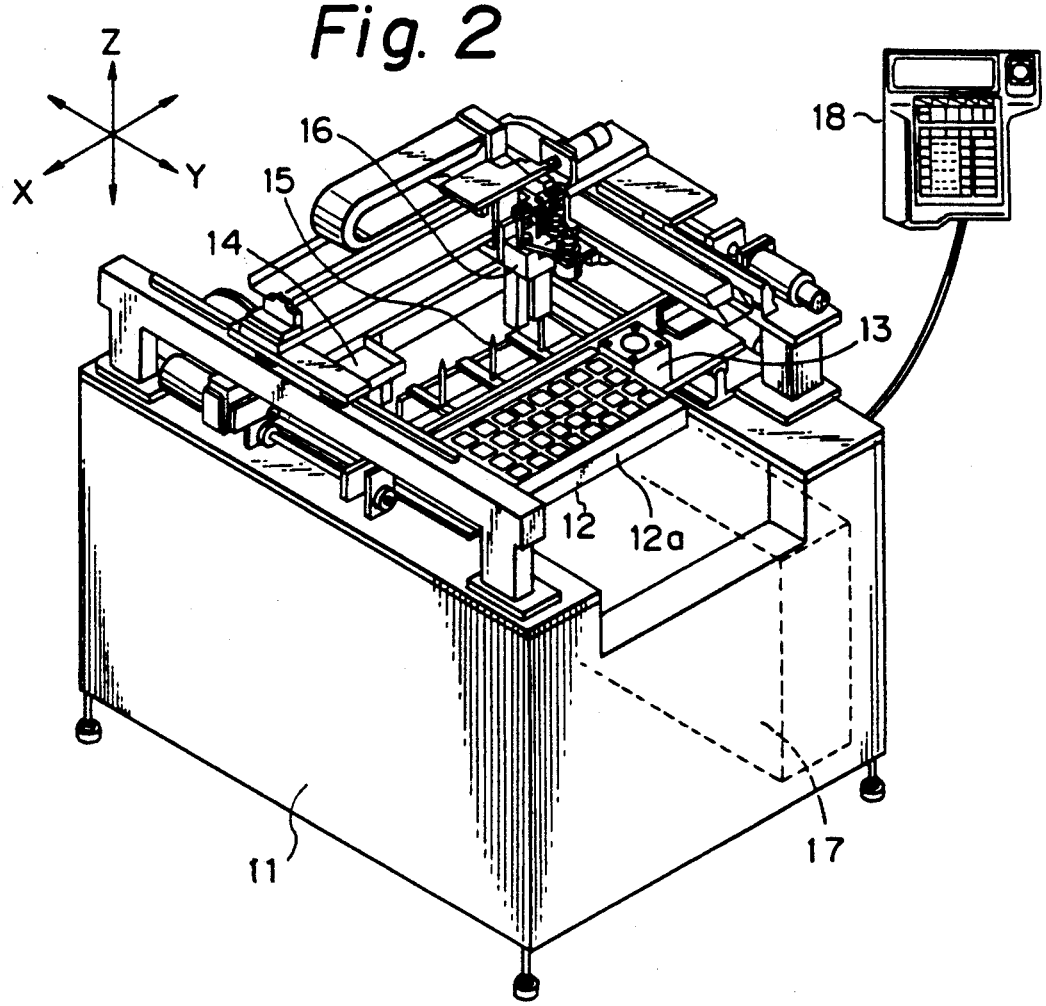
FIG. 2 is a perspective view of a first embodiment of the invention.

FIG. 2 is a perspective view of an electronic component mounting apparatus according to a first embodiment of the invention. The first embodiment is particularly suitable for use in an electronic component mounting apparatus which is adapted for use with relatively expensive components.

Shown at 11 is a body of the apparatus on which a component supply section 12 is defined. A tray 12a is set on the component supply section 12. A plurality of electronic components are received and arrayed in the tray. Although only one tray is shown in the figure, two or more trays may be set on the component supply section 12. Further, one or more tape feeders may be utilized instead of or together with the tray. A recognition device 13 is mounted on the body 11 adjacent to the tray 12a. A component disposal section 14 is defined on the body 11 apart from the recognition device 13.

The recognition device is designed to recognize the image of an electronic component and to judge whether the component is suitably held by a mounting head 16, and whether the shape of the component itself is suitable, for being mounted on a base member of an electronic module such as, for example, a printed circuit board. More particularly, the recognition device 13 is designed to recognize the shape of an electronic component and to measure any error in the positioning of the component with respect to the head 16. Reference data is preset for use in the judgement. The judgement is carried out by comparing the reference data with actual data of the image of the component obtained by the recognition device 13.

A support member 15 is mounted on the body 11 adjacent to the tray 12a for supporting a circuit board thereon.

The mounting head 16 is designed to be movable in three directions designated by the arrows X, Y and Z, respectively, shown in FIG. 2. The mounting head includes a vacuum nozzle (not shown) for applying suction to hold a selected electronic component. The head 16 carries the component to any designated place.

The apparatus is computer-controlled according to a program.

First, the head 16 is moved onto an electronic component designated in the program and then applies suction to hold it. The head is then moved above the recognition device 13. The recognition device recognizes the image of the component held by the head and judges whether the component is suitable for being mounted on the circuit board. When the judgement is "suitable", the head is moved to a position on the circuit board designated in the program and then mounts the component on the board at the proper place. When the judgement is "unsuitable", the head is moved to the position on the tray where the component was previously stored or to the component disposal section 14. When a component is judged to be unsuitable for mounting and need not be returned to the original position on the tray, the component is disposed of in the disposal section. However, only components which are cheap and need not be recovered for re-use are disposed of in the disposal section.

Shown at 17 is a controller disposed in the body 11 and including a processor 21, a memory means 22, an input-output module 23, and a motor driver 24. To the controller 17 are connected the recognition device 13, an actuating mechanism 11a for moving the mounting head 16 and an operator board 18. Operator operates the apparatus through the operation board 18. The operation board is also used to input data about the components on the tray 12a such as, for example, data indicating the location of each component on the tray 12a (which will be referred to as component supply data hereinafter), and data indicating the positions on the circuit board on which respective electronic components are to be mounted (which will be referred to as mounting data), and so on.

Figure 3:
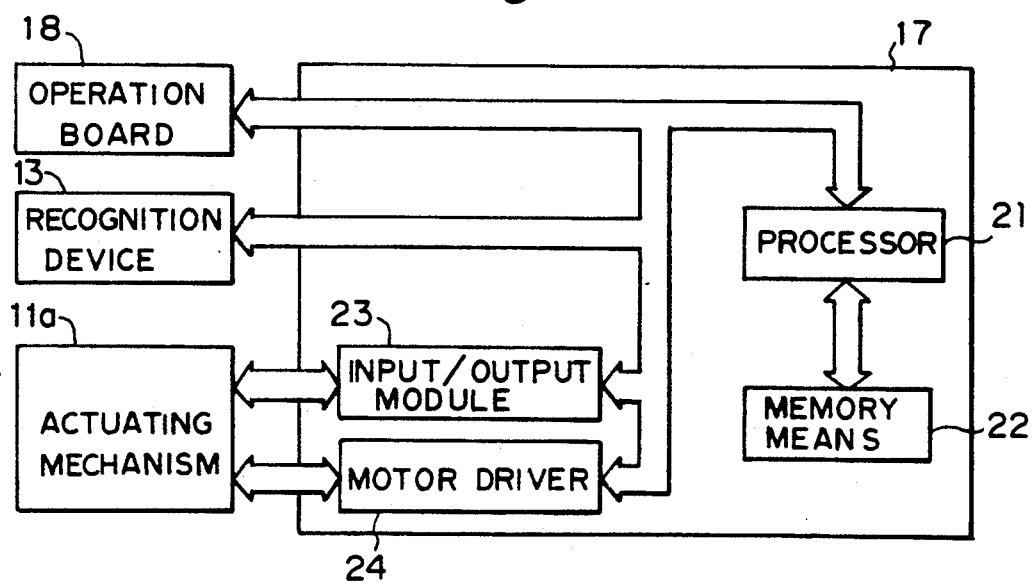
FIG. 3 is a block diagram of a control system of the apparatus shown in FIG. 1.

FIG. 3 is a block diagram of the control system of the first embodiment. The processor 21 carries out the processes shown in FIGS. 4A to 4C according to a program stored in the memory means 22.

Figure 4A:
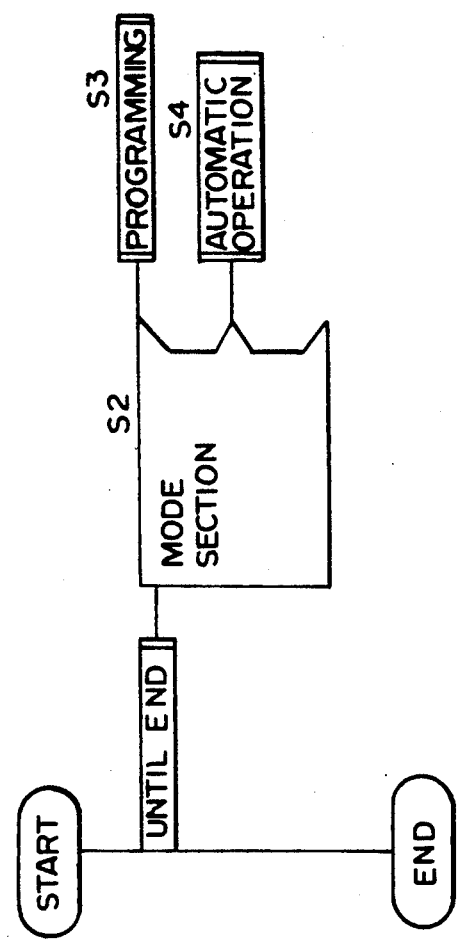
FIGS. 4A, 4B and 4C are in conjunction a program analysis diagram of the control system of FIG. 2.
Figure 4B:
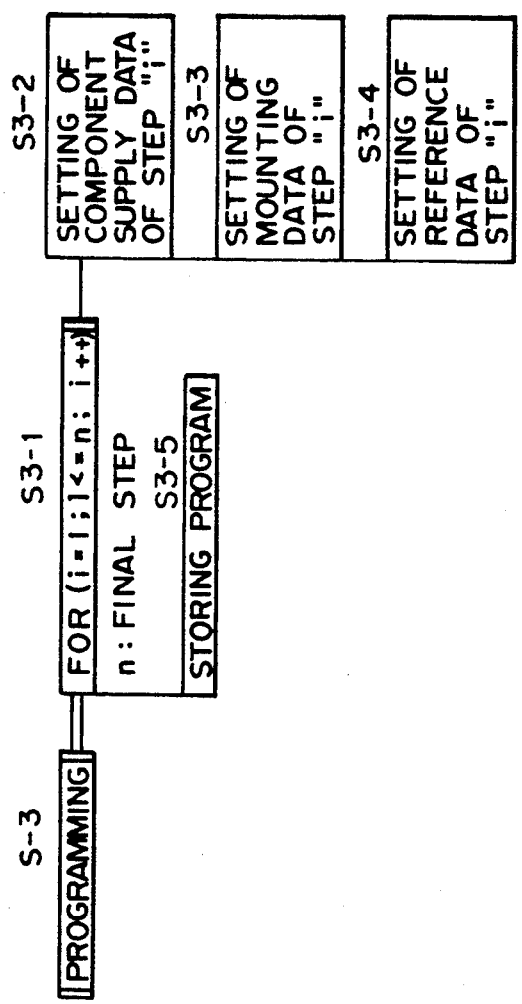
Figure 4C:
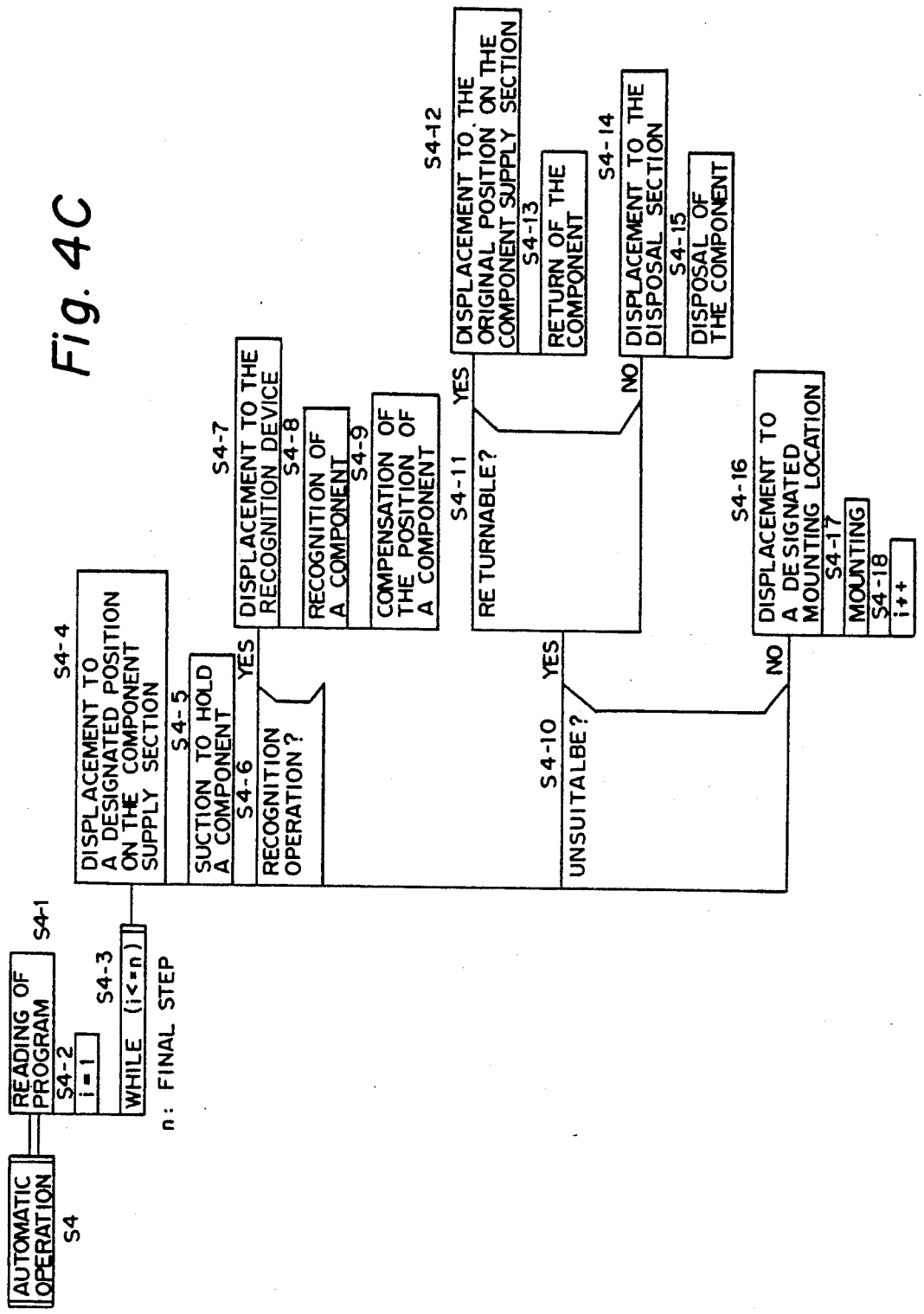

FIGS. 4A to 4C are PADs or program analysis diagrams showing control processes carried out in each section of the electronic component mounting device.

FIG. 4A is a PAD for controlling the overall apparatus.

S (step) 1: The apparatus is kept in an operable condition during the period of time from when a power source of the apparatus is switched on to when the power source is switched off.

S2: Mode selection is carried out. Two modes—"programming" and "automatic operation"—are displayed on a display device of the operation board 18. When the "programming" mode is selected, the operation state advances to S3, while the operation state advances to S4 when the "automatic operation" mode is selected.

S3: A program is prepared according to the processes shown in FIG. 4B.

S4: The program prepared at S3 is read and memorized in the memory means 22 an automatic operation shown in FIG. 4C is carried out.

FIG. 4B shows processes for programming.

S3: Programming is to be carried out.

S3-1: Processes shown at S3-2, S3-3 and S3-4 are repeated for each step number i from 1 to n. "n" is the final step of the program, namely "n" is the number of electronic components to be mounted on the circuit board.

S3-2: Component supply data corresponding to step number "i" is inputted. Namely, an operation is carried out to input data about locations where respective components are positioned and to also input data about supply methods of components.

S3-3: An operation is carried out to input mounting data corresponding to step number "i".

S3-4: An operation is carried out to set reference data. Namely, a setting operation is carried out to set the shape of a component and the condition for judging the unsuitability of the component.

S3-5: An operation is carried out to store the program. According to the processes mentioned above, the program shown in FIG. 5 is prepared and stored. FIG. 4C shows processes for automatic operation.

S4: The automatic operation is to be carried out.

S4-1: An operation is carried out to read the program prepared at step S3 and to memorize it in the memory means 22.

S4-2: An operation is carried out to set the program in the initial state. Namely, step number "i" is set to "1".

S4-3: The processes shown at S4-3, S4-4, S4-5, S4-6 and S4-10 are repeated through step numbers 1 to n.

S4-4: The mounting head 16 is moved to a position on the tray 12a designated in the program.

S4-5: The mounting head 16 is supplied with suction to pick up a designated component from the tray and hold it.

S4-6: An operation is carried out to determine whether the component needs to be subjected to a recognition operation. When a recognition operation is required, the process of S4-7 is next carried out. In the present embodiment, a centering operation of small chip type components with respect to the mounting head 16 is carried out by means of a mechanical chuck and recognition operation by the recognition device 13 is not carried out for those small chip type components.

S4-7: The mounting head 16 is moved to carry the component above the recognition device 13.

S4-8: The recognition device recognizes the image of the component.

S4-9: An operation is carried out to compensate for the error in the position of the component relative to the mounting head 16. Namely, an operation is performed to correct the mounting data for the component held by the head 16 by a value corresponding to the error in the position of the component relative to the head 16 so that the component can be mounted correctly at the designated location on the circuit board.

S4-10: The recognition device 13 judges whether the component is suitable for mounting by comparing the real data obtained at S4-8 with the reference data preset in the program. When the component is judged to be unsuitable, the operation state advances to S4-11.

S4-11: An operation is carried out to judge whether the component is to be returnable to the position where it was previously stored. In this embodiment, when the component is supplied from a tray, the component is judged to be returnable to the original position while, when the component is supplied from a tape feeder, the component is judged to be unreturnable to the original position. When the component is returnable to the original position, the operation state advances to S4-12 while, when the component is unreturnable to the original position, the operation state advances to S4-14.

S4-12: The head 16 is moved to carry the component judged to be returnable to the position on the tray 12a where the component was originally stored.

S4-13: The head 16 releases the component so that the component is received and stored again at the original location on the tray 12a. Then the operation state returns to S4-4. The mounting head is moved to a position on the tray 12a re-designated in the program to take another component which is the same kind as the previous one, and then the processes mentioned above are repeated.

S4-14: The head 16 is moved to carry the component judged to be unreturnable at S4-11 to the component disposal section 14.

S4-15: The mounting head 16 releases the component to dispose of it at the disposal section 14. Then the operation state returns to S4-4. The mounting head is moved to a position on the tray 12a re-designated in the program to take another component which is the same kind as the previous one, and then the processes mentioned above are repeated.

S4-16: When the component is judged to be suitable for mounting at S4-10, the mounting head 16 is moved to a mounting location, namely, a position on the circuit board designated in the program. When a component is judged not to need recognition at S4-6, the component is also judged whether it is suitable for mounting at a step corresponding to S4-10 by means of another judging means based on the respective reference data.

S4-17: The mounting head mounts the component on the circuit board at the designated mounting location.

In this manner, the processes mentioned above are repeated until the step number "i" is set to "n", so that components of a total number n are mounted on the circuit board. The operation state returns to S4, while the previously mounted circuit board is discharged out of the apparatus and a new one is supplied. The same processes as mentioned above are repeated until a predetermined number of circuit boards are completed, and then the operation state returns to S2.

According to the embodiment mentioned above, components judged to be unsuitable for mounting by the recognition device 13 are returned to and stored in the respective original positions on the tray 12a or component supply section 12, not on the component disposal section 14, while components judged to be suitable for mounting can be correctly mounted on the circuit board. When returned to the original positions, the components keep the state when they are judged to be unsuitable for mounting. It is therefore possible to determine specific defects in the unsuitable components such as, for example, error in length and bends of leads of the components. Since components judged to be unsuitable for mounting are returned to the respective original positions on the component supply section 12, it is possible to also determine the rate at which particular defects occur in different types of components and further to determine relationships between the locations of components on a tray and the rate of defects. As a result, it is also possible to find out and solve problems in the method employed to carry the trays as well as to find out and prevent suction action of the mounting head which can cause the components to be damaged.

It is also possible to know the state of recognition of the recognition device 13, namely, whether the device makes mis-judgement whether there is an error in the judgement, and so on, since an operator can compare the results of the judgement with the actual component judged to be unsuitable for mounting. As a result, it is possible to improve the rate at which suitable components are properly mounted.

In an alternative embodiment, components judged to be unsuitable for mounting may be carried to and stored on a storing section (not shown) other than the disposal section 14 and the tray 12a.

Figure 6:
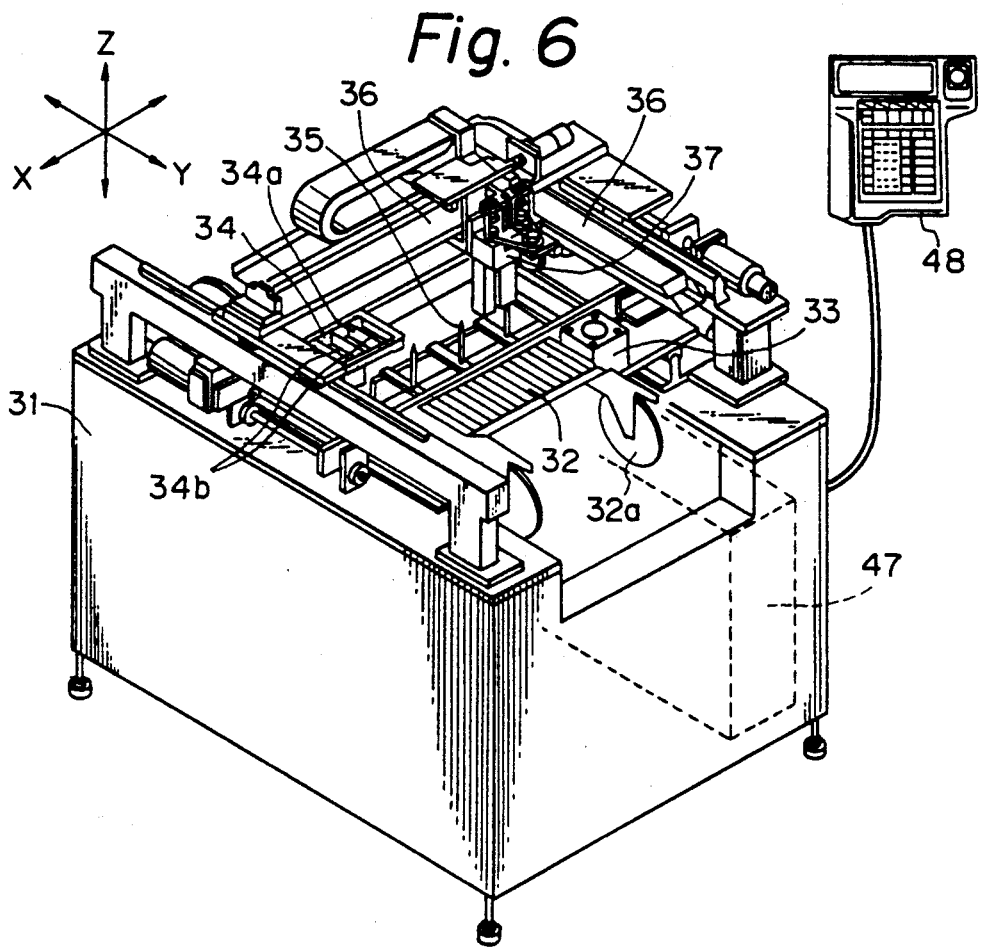
FIGS. 6 and 7 are similar views to FIGS. 1 and 2, respectively, but of a second embodiment of the invention.

FIG. 6 is a perspective view of a second embodiment of the invention. An explanation of the same elements as those of the first embodiment will be omitted.

A body 31 of the apparatus is provided with a component supply section 32 defined thereon in which a plurality of tape feeders 32a are arranged. A plurality of electronic components are arrayed in the component supply section 32. Shown at 33 and 34 are a recognition device and a component storing section, respectively. Reference numeral 35 designates a support member for supporting a circuit board (not shown) thereon.

An X·Y robot 36 is mounted on the body 31 and a mounting head 37 is vertically movably mounted on the X·Y robot 36. The mounting head 37 is therefore movable in the three directions designated by the arrows X, Y and Z, respectively, shown in FIG. 6. Although the mounting head 37 and the recognition device 33 of this embodiment operate in a similar manner to that in the first embodiment, an operation is further carried out in this embodiment to judge whether a component is held by the mounting head 37 in a suitable manner. When a component is not held by the head 37 in a suitable manner, a judgement is made that an error in the suction operation (suction error) has occurred. Namely, in this embodiment, components judged to be unsuitable for mounting because of a suction error are distinguished from components which are suitably held by the head 37 but judged to be unsuitable for mounting because of deformation or mis-positioning of components as in the case of the first embodiment. The component storing section 34 includes a plurality of compartments 34b partitioned by partition panels 34a. Components judged to be unsuitable for mounting are sorted according to the tape feeders from which the respective components were supplied and are also sorted according to whether the components are judged to be unsuitable for mounting because of a suction error or because of deformation or mis-positioning of a component, and are accordingly stored in the respective compartments 34b.

Figure 7:
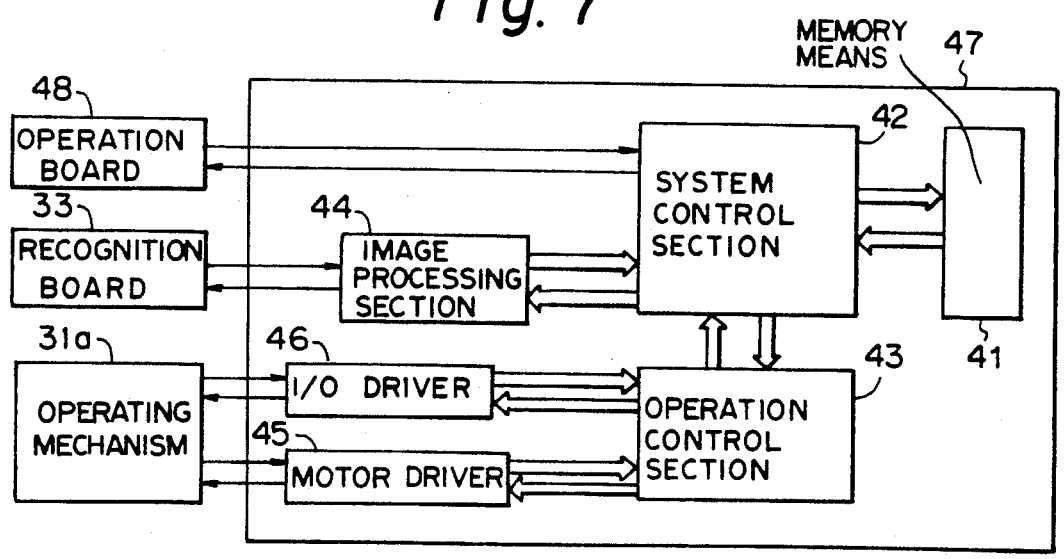

In the body 31 is disposed a controller 47 shown in FIG. 7 and including memory means 41, a system control section 42, an operation control section 43, an image processing section 44, a motor driver 45, and an input/output driver 46.

To the controller 47 are connected the recognition device, X·Y robot, mounting head 37 and an operation board 48. The X·Y robot 36 and mounting head 37 are represented by their operation mechanism 31a.

A program for this embodiment is prepared in the same manner as in the case of the first embodiment.

Figure 8:
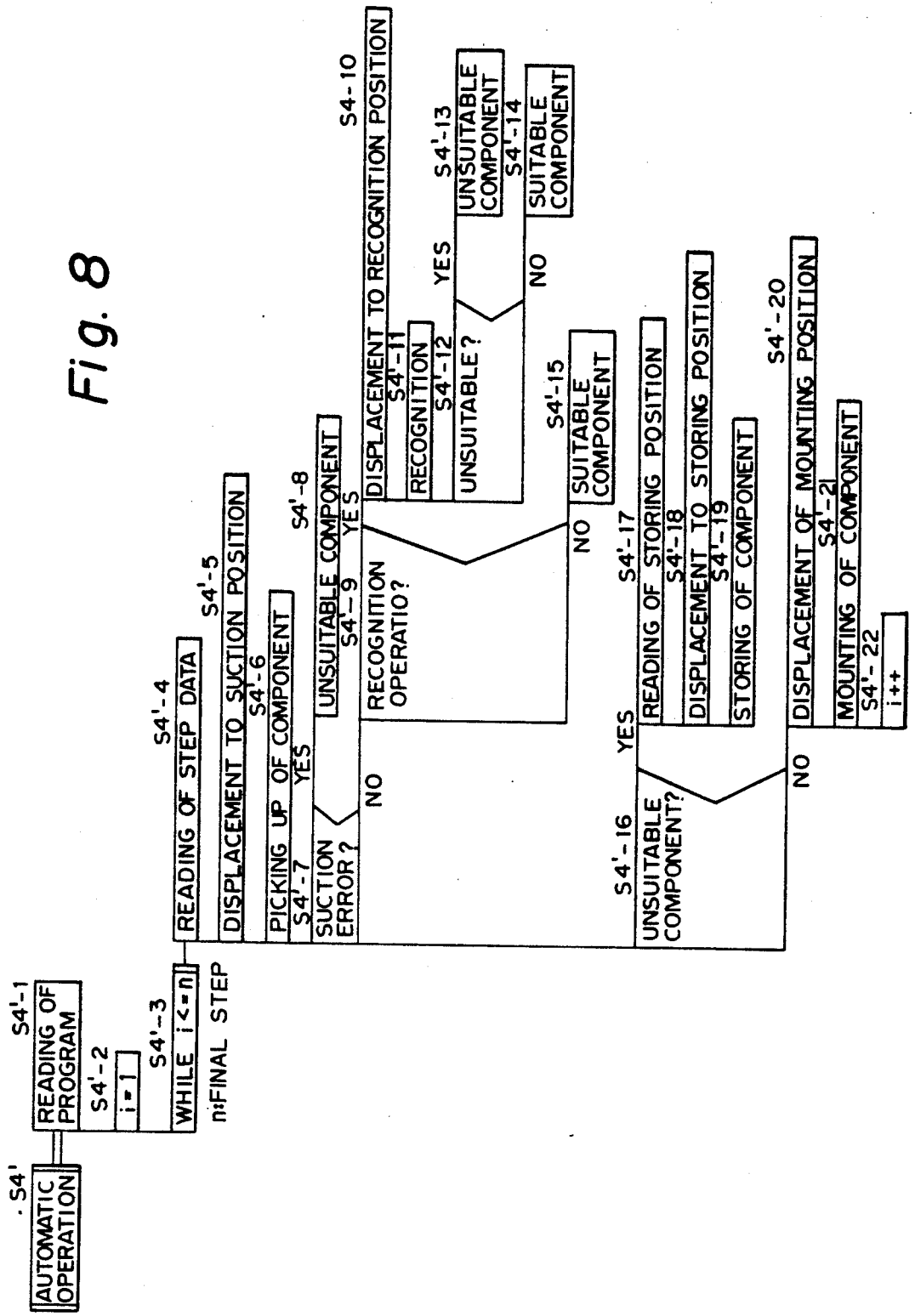
FIG. 8 is a program analysis diagram of the second embodiment.

The system control section 42 controls the system to carry out the automatic mounting processes of the PAD shown in FIG. 8, according to a program shown in FIG. 9 which is memorized in the memory means 41, and using the data shown in FIGS. 10 and 11 which are also memorized in the memory means 41. FIGS. 10 and 11 are a table of component data and a table of storing positions, respectively.

S4': The automatic mounting operation is to be carried out.

S4'-1: An operation is carried out to read the program and memorize it in the memory means 41.

S4'-2: An operation is carried out to set the program in the initial state. Namely, step number "i" is set to "1".

S47-3: The processes of S4'-4 to S4'-16 are repeated through step numbers 1 to n.

S4'-4: An operation is carried out to read the data corresponding to the step number i shown in FIG. 9.

S4'-5: The mounting head 37 is displaced to the suction position on the component supply section 32 designated in the memory where the component designated in the program is located.

S4'-6: The mounting head 37 applies suction to pick up the designated component from the component supply section 32 and hold it.

S4'-7: An operation is carried out to judge whether the component is properly held by the mounting head 37, namely whether a suction error has occurred. The operation state advances to S4'-8 when a suction error has occurred while the operation state advances to S4'-9 when a suction error has not occurred. The judgement is carried out by detecting the vacuum in the mounting head 37.

S4'-8: When a suction error has occurred, the component is judged to be unsuitable for mounting, and then the operation state advances to S4'-16.

S4'-9: An operation is carried out to judge whether the component needs to be recognized by the recognition device 33. The judgement is carried out on the basis of the data shown in FIG. 10. The operation state advances to S4'-10 when recognition is required while the operation state advances to S4'-15 when recognition is needless.

S4'-10: The mounting head is moved to carry the component above the recognition device 33.

S4'-11: The recognition device 33 recognizes the image of the component.

S4'-12: The recognition device 33 judges whether the component is suitable for mounting by comparing the real data obtained by the device 33 with preset reference data. The operation state advances to S4'-13 when the component is judged to be unsuitable while the operation state advances to S4'-14 when the component is judged to be suitable.

S4'-13: An operation is carried out to recognize the component judged to be unsuitable at S4'-12 as an unsuitable component.

S4'-14: An operation is carried out to recognize the component judged to be suitable at S4'-12 as a suitable component.

S4'-15: An operation is carried out to recognize the component judged not to need recognition at S4'-9 as a suitable component.

S4'-16: An operation is carried out to judge whether the component is a suitable one, and whether the unsuitable component is judged to be unsuitable because of a suction error or because of the results of the recognition of image thereof by the recognition device 33. The operation state advances to S4'-17 when the component is unsuitable while the operation state advances to S4'-20 when the component is suitable.

S4'-17: An operation is carried out to read the component storing number shown in FIG. 10 corresponding to the component number of the component being held by the mounting head 37 and further read the component storing position data shown in FIG. 11 corresponding to the component storing number.

S4'-18: The mounting head 37 is moved to carry the component to the component storing position data read at S4'-17.

S4'-19: The mounting head 37 releases the component, so that the component is received and stored in the compartment 34a located at the position corresponding to the component storing position data read at S4'-17.

S4'-20: When the component is suitable for mounting, the mounting head is moved to the mounting position shown in FIG. 9 corresponding to the component number of the component being held by the mounting head 37.

S4'-21: The mounting head mounts the component on the circuit board at the mounting position.

S4'-22: The step number i is increased by 1 and the operation state returns to S4'-3. When the operation mentioned above has been completed with the step numbers i having been incremented from 1 through n, one circuit board is completed, and the operation state returns to S4'. The same processes as mentioned above are repeated until a predetermined number of circuit boards are completed.

Since components judged to be unsuitable are stored in a component storing section in this embodiment, it is possible to quickly know the mounting success rate of the components without any production managing information which has been especially gathered and arranged in a special form. It is very convenient for studying the reasons why components are judged to be unsuitable and to sort them according to respective component numbers and into classes of unsuitability.

Figure 12:
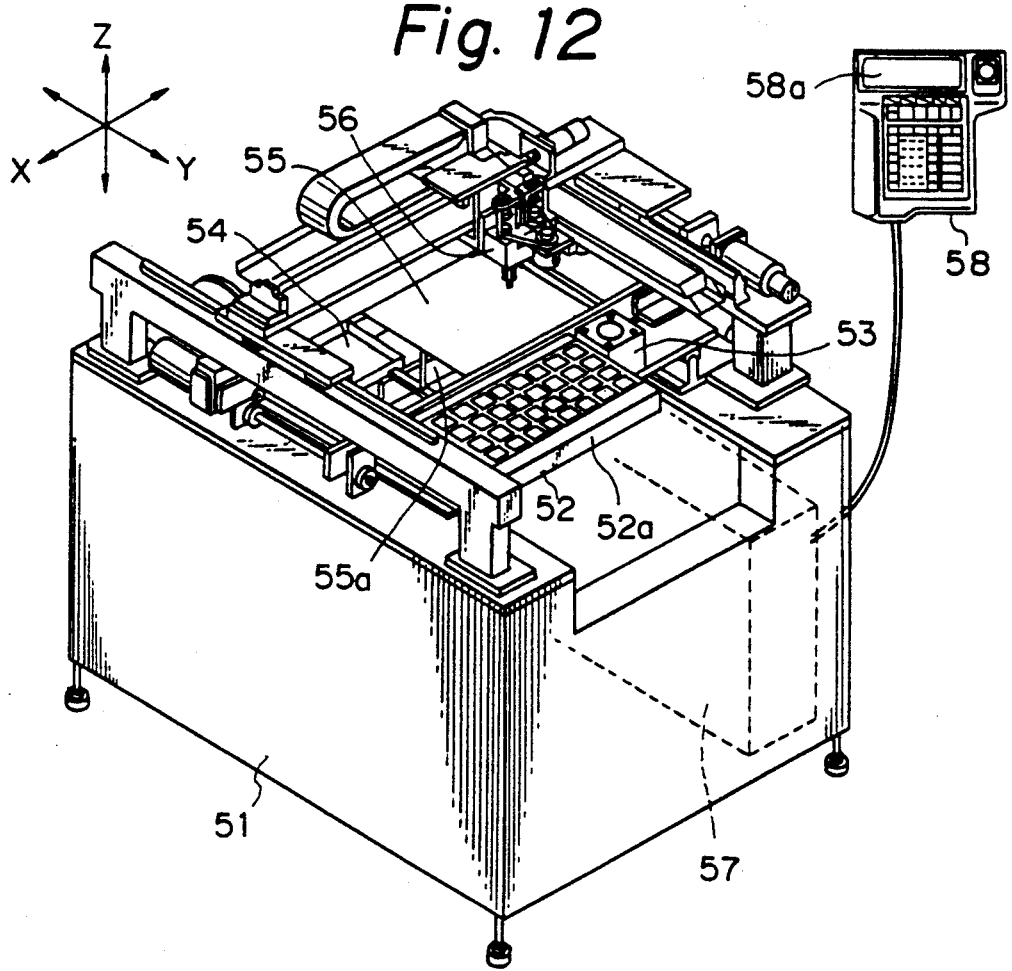
FIGS. 12 and 13 are similar views to FIGS. 1 and 2, respectively, but of a third embodiment.

FIG. 12 is a perspective view showing a third embodiment of the invention. This embodiment is particularly suitable for gathering production managing information while an electronic component mounting apparatus is running. A detailed explanation of the same elements as those employed in the first and second embodiments will be omitted.

A body 51 of the apparatus is provided with a component supply section 52 defined thereon in which a tray 52a is mounted. A plurality of electronic components are received and arrayed in the tray 52a. Shown at 53 and 54 are a recognition device and a component disposal section, respectively. The recognition device 53 recognizes the image of a component in the same manner as in the first and second embodiments.

A support member 55a is mounted on the body 51 for supporting a circuit board 55 on which electronic components are mounted.

A mounting head 56 including a plurality of vacuum nozzles (not shown) is movable in the three directions designated by the arrows X, Y and Z. The mounting head 56 operates in the same manner as in the case of the first and second embodiments. Nozzles are selectively used according to the kinds of components to be picked up.

A controller 57 disposed in the body 51 includes a processor 61 for comparing, reading and writing various data, memory means 62 for storing data, an input/output module 63, and a motor driver 64.

Shown at 58 is an operation board. The operation board is used to input component supply data, mounting data and reference data which are basically the same as those in the first embodiment. Suction data is also inputted. The suction data is for determining the level of vacuum at which the head 56 applies suction to hold a component and the timing of a picking up operation of a component of the head 56. Shown at 18a is a display on which data can be displayed.

Figure 13:
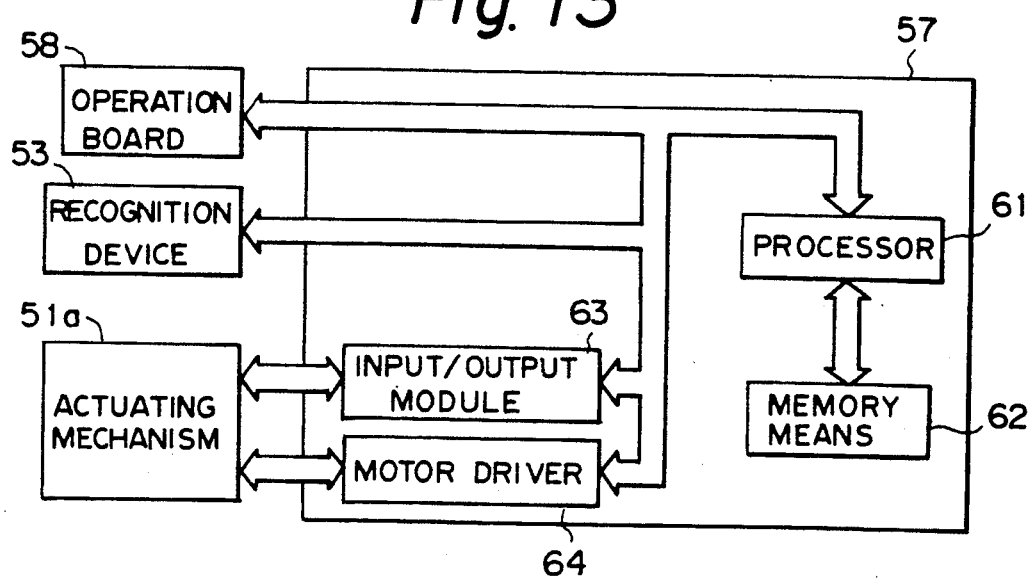
Figure 14:
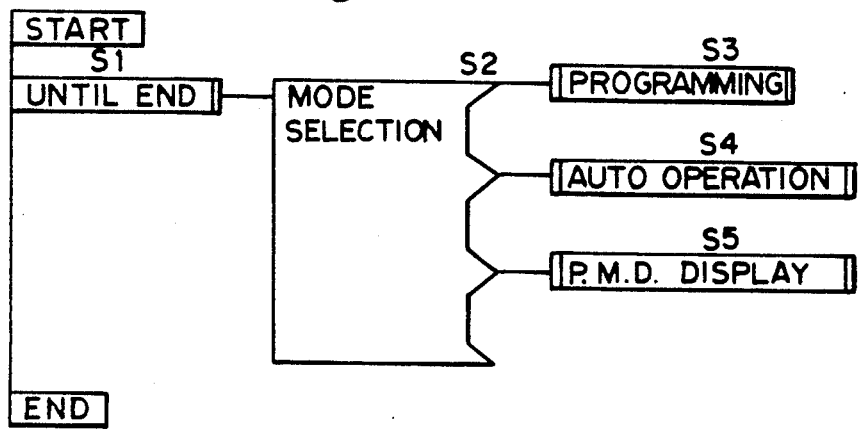
FIGS. 14, 15, 16, 17 and 18(a) & (b) are in conjunction a program analysis diagram of the third embodiment.
Figure 15:
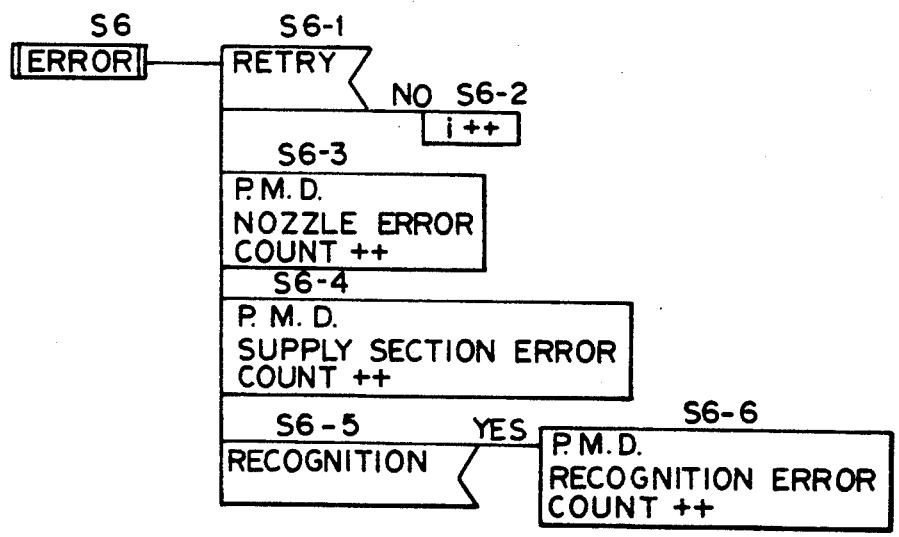
Figure 16:
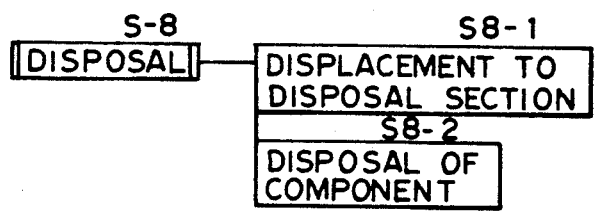
Figure 17:
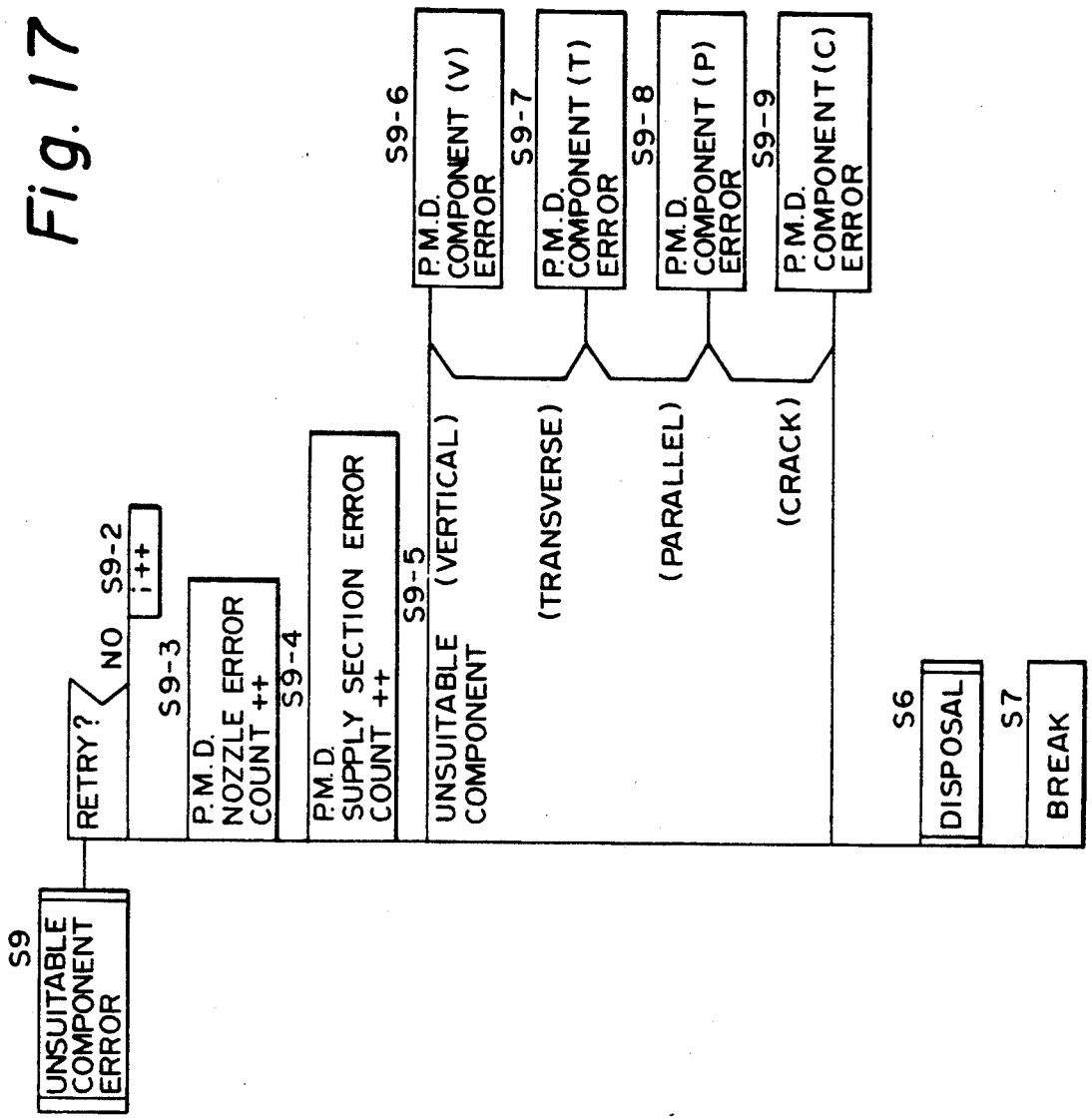
Figure 18A:
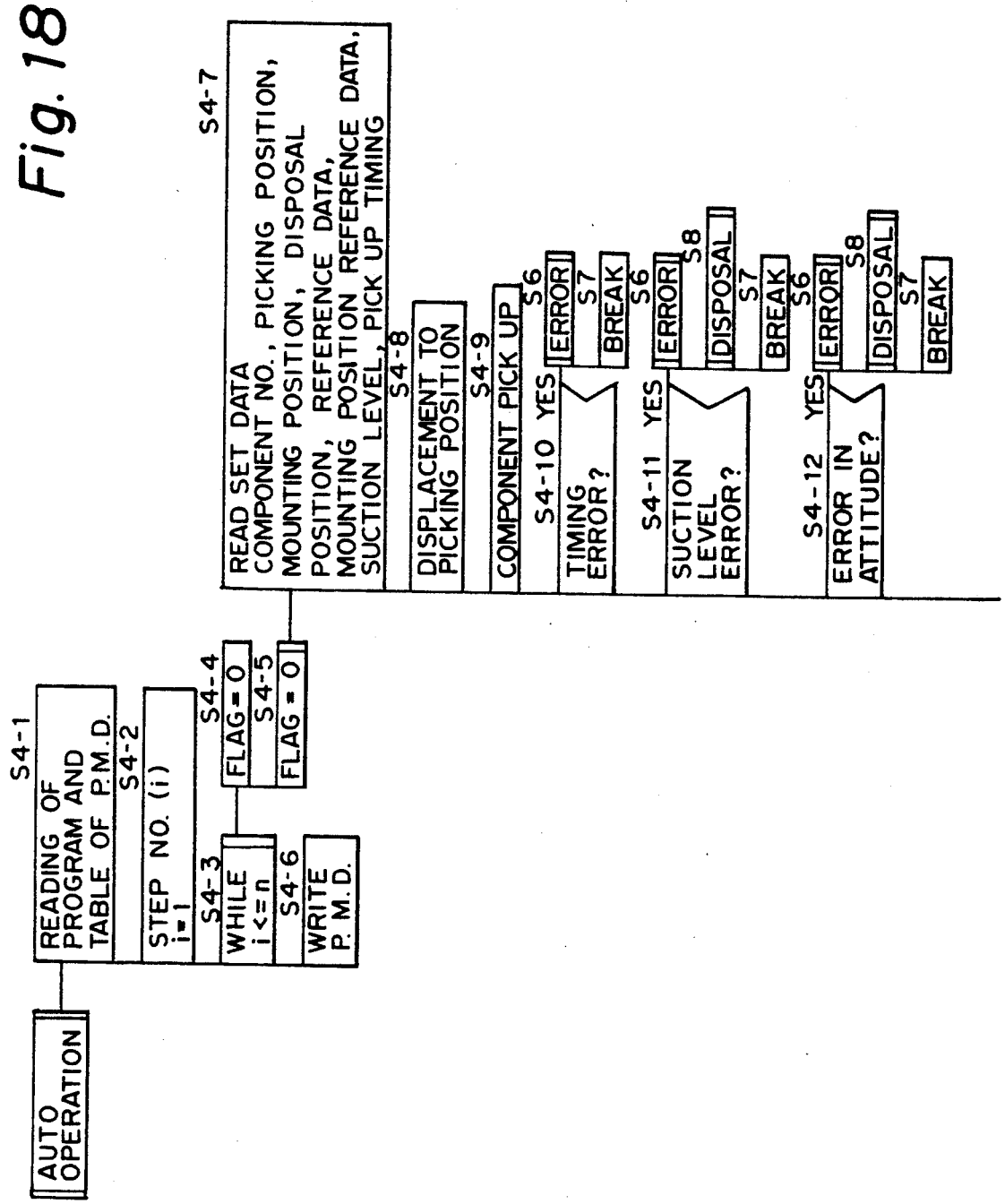
Figure 18B:
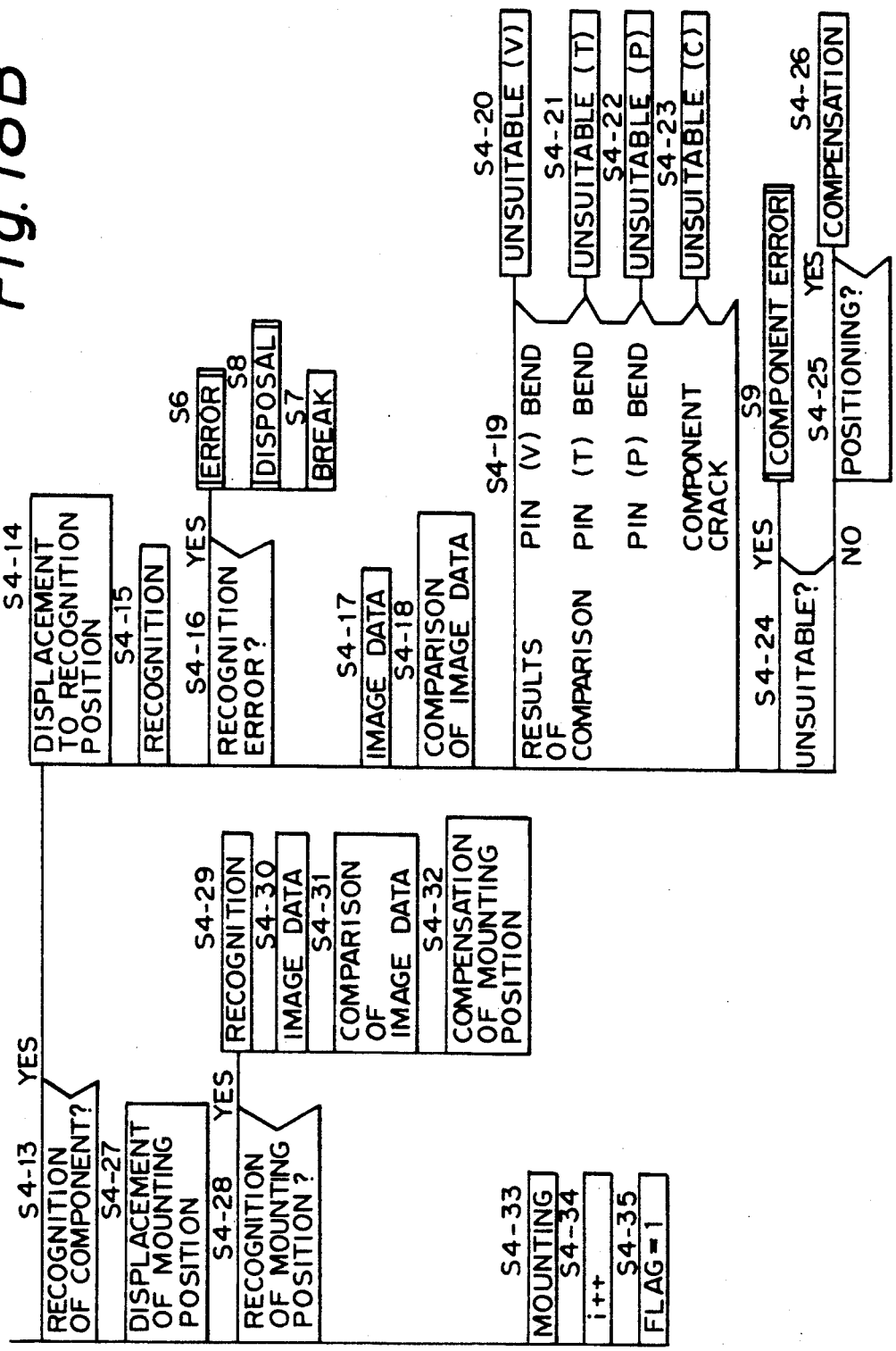

FIG. 13 is a block diagram of the above-described control system. The processor 61 carries out the processes shown in FIGS. 14 to 18 according to a program stored in the memory means 62.

S1: The apparatus is kept in an operable condition during the period of time from a switching on of a power source of the apparatus to a switching off thereof.

S2: Mode selection is carried out.

S3: The component supply data, mounting data, reference data and so on are inputted through the operation board 58, so that an active program for automatic operation is prepared. The program is shown in FIG. 19. The data mentioned above are referred to as set data.

S4: An operation is carried out to read the program prepared at S3 and memorize it in the memory means 62 and to carry out the automatic operation shown in FIG. 18.

S4-1: An operation is carried out to read and memorize the active program and a table of production managing data (PMD). The table of production managing data is shown in FIGS. 20A, 20B and 20C. In the initial state, data in all the columns in the table are cleared.

S4-2: An operation is carried out to set the program in the initial state. The step number "i" is set to "1".

S4-3: Operations of mounting components are repeated through step numbers 1 to n.

S4-4: An operation is carried out to set in the initial state the flag for determining whether the mounting of a component has been completed. When the flag is "1", it means that mounting has been completed.

S4-5: While the flag is "0", processes from S4-7 to S4-35 or a mounting operation is repeated. When a mounting operation has been completed, the flag is changed to "1".

S4-7: An operation is carried out to read out set data corresponding to a step number i.

S4-8: The mounting head 56 is moved to the corresponding picking position where the component designated in the program is located.

S4-9: The mounting head 56 is supplied with suction to pick up the designated component. S4-10: An operation is carried out to judge whether there has been an error in the timing of the picking up operation of the component by the head 56. The mounting head 56 is provided with a sensor for detecting the vacuum pressure in the vacuum nozzle. When a predetermined period time has lapsed before the vacuum in the vacuum nozzle reaches a predetermined level after the suction operation of the nozzle has begun, a judgement is made that there has been an error in the timing of the picking up operation. The operation state advances to S6 when there has been an error, while the operation state advances to S7 when there has not been an error.

S6: Error processes are carried out.

S6-1: An operation is carried out to judge whether a mounting operation should be re-tried. The numbers of re-tries to be carried out are preset with respect to the respective components. When a mounting operation is not to be re-tried, the operation state advances to S6-2.

S6-2: The step number "i" is increased by "1".

S6-3: An operation is carried out to add "1" to the counter which counts errors of the nozzle being used. Namely, "1" is added to the data of "nozzle error" in the table shown in FIG. 20C corresponding to the nozzle number of the nozzle being used.

S6-4: An operation is carried out to add "1" to the data of "component supply section error" in the table shown in FIG. 20B corresponding to the picking position of the component being held by the head 56.

S6-5: An operation is carried out to judge whether there has been a recognition error. When the recognition device 53 is not able to recognize the image of a component because of a bad image and/or of an extreme mis-positioning of the component, a judgement is made that a recognition error has occurred. The operation state advances to S6-6 when a recognition error has occurred while the operation state returns to S4-11 when a recognition error has not occurred.

S6-6: An operation is carried out to add "1" to the data of "recognition error" shown in FIG. 20A corresponding to the component number of the component being held by the head 56.

S4-11: An operation is carried out to judge whether there has been an error in the suction level of the nozzle. The judgement is made by detecting the vacuum pressure in the nozzle. When a suction level error has occurred, the operation state advances to S6 where error processes will be carried out, and to S8 where the component will be disposed of, and further to S7. When there has not been a suction level error, the operation state advances to S4-12.

Figure 21:
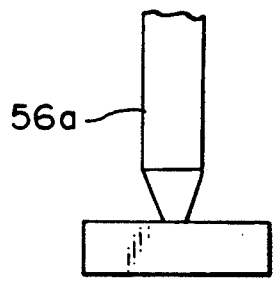
FIG. 21 is an elevational view of a nozzle shown as holding a component in a suitable manner.
Figure 22:
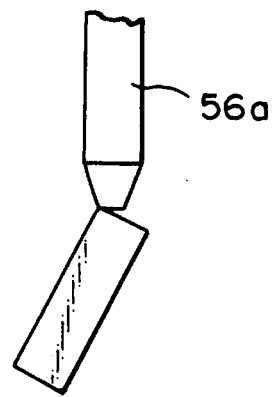
FIG. 22 is an elevational view of a nozzle shown as holding a component in an unsuitable manner.

S4-12: An operation is carried out to judge whether there has been an error in the attitude of the component. When a component is held by a nozzle 56a in the manner shown in FIG. 21, it is judged to be suitable. When a component is held by the nozzle 56a in the manner shown, for example, in FIG. 22, a judgement is made that a component attitude error has occurred. When there has been a component attitude error, the operation state advances to S6, S8 and S7 in this order. When there has been a component attitude error, the operation state advances to S4-13.

S4-7: The operation state returns to S4-5.

S8: Disposal processes are carried out.

S8-1: The mounting head 56 is moved to the component disposal section 54.

S8-2: The mounting head 56 releases the component to dispose of it at the component disposal section 54.

S4-13: An operation is carried out to judge whether the component requires recognition of the image thereof. When recognition is required, the operation state advances to S4-14. When recognition is not required, the operation state advances to S4-27.

S4-14: The mounting head is moved above the recognition device 53.

S4-15: The recognition device recognizes the image of the component.

S4-16: A judgement is made as to whether there has been a recognition error. When there has been a recognition error, the operation state advances to S6, S8, and S7 in this order and then returns to S4-5. When there has not been a recognition error, the operation state advances to S4-17.

S4-17: The recognition device observes the image of the component.

S4-18: The processor 61 compares the image data obtained at S4-17 with the reference data.

S4-19: The processor 61 sorts the origins of unsuitability of the component by using the results of the comparison carried out at S4-18.

S4-20: When a pin or lead of the component is vertically bent beyond a predetermined extent, the vertical bend is recognized as the cause of unsuitability of the component.

S4-21: When a pin or lead of the component is transversely bent beyond a predetermined extent, the transverse bend is recognized as the cause of unsuitability of the component.

S4-22: When a pin or lead of the component is bent parallel to the body of the component beyond a predetermined extent, the parallel bend is recognized as the cause of unsuitability of the component.

S4-23: When there is a crack in the component, the crack is recognized as the cause of unsuitability of the component.

Sr-24: A judgement is made as to whether the component is suitable or not for mounting. The operation advances to S9 when the component is judged to be unsuitable while the operation state advances to S4-25 when the component is judged to be suitable.

S9: Error processes for an unsuitable component are carried out.

S9-1: An operation is carried out to judge whether re-trying the mounting operation is to be re-tried. The operation advances to S9-3 when re-trying is to be carried out while the operation state advances to S9-2 when re-trying is not to be carried out.

S9-2: The step number "i" is increased by "1".

S9-3: An operation is carried out to add "1" to the data of "nozzle error" in the table shown in FIG. 20C corresponding to the nozzle number of the nozzle being used.

S9-4: An operation is carried out to add "1" to the data of "component supply section error" in the table shown in FIG. 20B corresponding to the picking position of the component being held by the head 56.

S9-5: An operation is carried out to add "1" to the data of "component error" in the table shown in FIG. 20A corresponding to the component number of the component being held by the head 56.

S9-6: When a vertical bend of a pin of the component is recognized as a cause of unsuitability of the component at S4-20, an operation is carried out to add "1" to the data of "vertical bend error" in the table shown in FIG. 20A corresponding to the component number of the component.

S9-7: When a transverse bend of a pin of the component is recognized as a cause of unsuitability of the component at S4-21, an operation is carried out to add "1" to the data of "transverse bend error" in the table shown in FIG. 20A corresponding to the component number of the component.

S9-8: When a parallel bend of the component is recognized as a cause of unsuitability of the component at S4-22, an operation is carried out to add "1" to the data of "parallel bend error" in the table shown in FIG. 20A corresponding to the component number of the component.

S9-9: When a crack in the component is recognized as a cause of unsuitability of the component at S4-23, an operation is carried out to add "1" to the data of "crack error" in the table shown in FIG. 20A corresponding to the component number of the component.

S8: Disposal processes are carried out and then the operation state advances to S7 and returns to S4-5.

S4-25: An operation is carried out to judge whether the component is positioned in a proper place relative to the mounting head 56. When the positioning of the component is suitable, the operation state advances to S4-27. When the positioning of the component is unsuitable, the operation state advances to S4-26.

S4-26: An operation is carried out to compensate for an error in the positioning of the component.

S4-27: The mounting head 56 is moved to the mounting position designated in the program.

S4-28: An operation is carried out to judge whether recognition of the mounting position is required. When recognition is required, the operation state advances to S4-29. When recognition is not required, the operation state advances to S4-33.

S4-29: Recognition of the mounting position is carried out by using another recognition device (not shown) mounted on the mounting heat 56.

S4-30: The recognition device on the head 56 recognizes the image of the mounting position.

S4-31: The processor compares the image data obtained at S4-30 with the set data.

S4-32: An operation is carried out to compensate for the error in the positioning of the component.

S4-33: The head 56 mounts the component on the circuit board at the mounting position.

S4-34: The step number "i" is increased by "1" and the flag for determining the completion of mounting is switched to 1. The operation state returns to S4-3.

Processes mentioned above are repeated until the step number exceeds "n". When the step number exceeds "n", the operation state advances to S4-6 where the production managing data stored in the processor 61 is written into the memory means 62.

S5: The production managing data stored in the memory 62 is displayed on a display panel 18a of the operation board.

As mentioned above, the apparatus of this embodiment can supply production managing information which is sorted into respective items according to the reasons for unsuitability of components, which enables a superior quality control of electronic components to be effected.

Since the components judged to be unsuitable for mounting are sorted according to the respective reasons for unsuitability of the components, it is possible to mark the unsuitable components with different colors or symbols according to the respective reasons for unsuitability. This enables immediate measures to be taken to deal with poor quality electronic components.

What is claimed is:

1. An electronic component mounting apparatus for automatically mounting electronic components at designated positions on a base member of an electronic module, said apparatus comprising:

a component supply section configured to support a supply of electronic components in a predetermined arrangement;

mounting head means for picking up an electronic component and for moving between said supply section and a designated place so as to be capable of picking up a component from said supply section and placing the component at a designated position on a base member located at said designated place;

recognition means for observing the image of a component held by said mounting head and for judging whether the component held by the mounting head is suitable for mounting on the base member in accordance with the manner in which the component is held by the mounting head and in accordance with the shape of the component itself; and controller means operatively connected to said mounting head and to said recognition means for operating said mounting head to sequentially pick up electronic components located at said supply section, to place the picked up component at a designated position on a base member located at the designated place whenever said recognition means judges the picked up component to be suitable for mounting, and to place the component back where it was picked up from at the component supply section whenever said recognition means judges the component to be unsuitable for mounting so long as the component is of a predetermined type of component.

2. An apparatus according to claim 1, wherein said controller means includes a memory in which reference data is stored, said recognition means is also for judging whether the components are suitable for mounting based on the reference data, said controller means is also for determining whether a component to be mounted on a base member at the designated place is to be observed by said recognition means, and said controller means includes judgement means for determining whether a component which is not to be observed by said recognition means is suitable for mounting.

3. An electronic component mounting apparatus for automatically mounting electronic components at designated positions on a base member of an electronic module, said apparatus comprising:

a component supply section configured to support a supply of electronic components in a predetermined arrangement;

mounting head means for picking up an electronic component and for moving between said supply section and a designated place so as to be capable of picking up a component from said supply section and placing the component at a designated position on a base member located at said designated place;

recognition means for observing the image of the component held by said mounting head and for judging whether the component held by the mounting head is suitable for mounting on the base member in accordance with the manner in which the component is held by the mounting head and in accordance with the shape of the component itself;

a component storing section having a plurality of areas; and controller means, including a memory in which component storing data is stored, operatively connected to said recognition means and to said mounting head for operating said mounting head to sequentially pick up electronic components located at said supply section, to place the picked up component at a designated position on a base member located at the designated place wherever said recognition means judges the picked up component to be suitable for mounting, and to place the component in a respective one of the areas of said component storing section, based on said component storing data, whenever said recognition means judges the picked up component to be unsuitable for mounting.

* * * * *